United States Statutory Invention Registration [19]

[11] Reg. Number: H111

Flesner [45] Published: Aug. 5, 1986

[54] GALLIUM ARSENIDE MATERIAL AND PROCESS EVALUATION BY MEANS OF PULSED PHOTOCONDUCTANCE IN TEST DEVICES

[75] Inventor: Larry D. Flesner, La Jolla, Calif.

[73] Assignee: The United States of America as represented by the Secretary of the Navy, Washington, D.C.

[21] Appl. No.: 806,573

[22] Filed: Nov. 21, 1985

[51] Int. Cl.[4] ..... G05B 23/00

[52] U.S. Cl. ..... 324/158 D; 324/158 R

[56] References Cited

U.S. PATENT DOCUMENTS

| | | | |
|---|---|---|---|
| 4,180,784 | 12/1979 | Nelson et al. | 331/94.5 PE |
| 4,205,265 | 5/1980 | Staebler | 324/158 D |
| 4,456,879 | 6/1984 | Kleinknecht | 324/158 D |
| 4,473,796 | 9/1984 | Nankivil | 324/57 R |
| 4,477,775 | 10/1984 | Fazekas | 324/158 R |
| 4,482,863 | 11/1984 | Auston et al. | 324/158 T |

*Primary Examiner*—John F. Terapane
*Assistant Examiner*—S. Wolffe
*Attorney, Agent, or Firm*—R. F. Beers; E. F. Johnston; Harvey Fendelman

[57] ABSTRACT

A method is disclosed for determining characteristics of semi-insulating gallium arsenide that can be used to evaluate the suitability of the material for semiconductor processing. An n-channel test device formed on a substrate of semi-insulating gallium arsenide is illuminated with pulses of light. The decay in the photoconductance that occurs due to the illumination is measured in order to enable characterization of the shallow acceptor impurities which compensate the deep donors in the semi-insulating gallium arsenide.

4 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FIG. 1
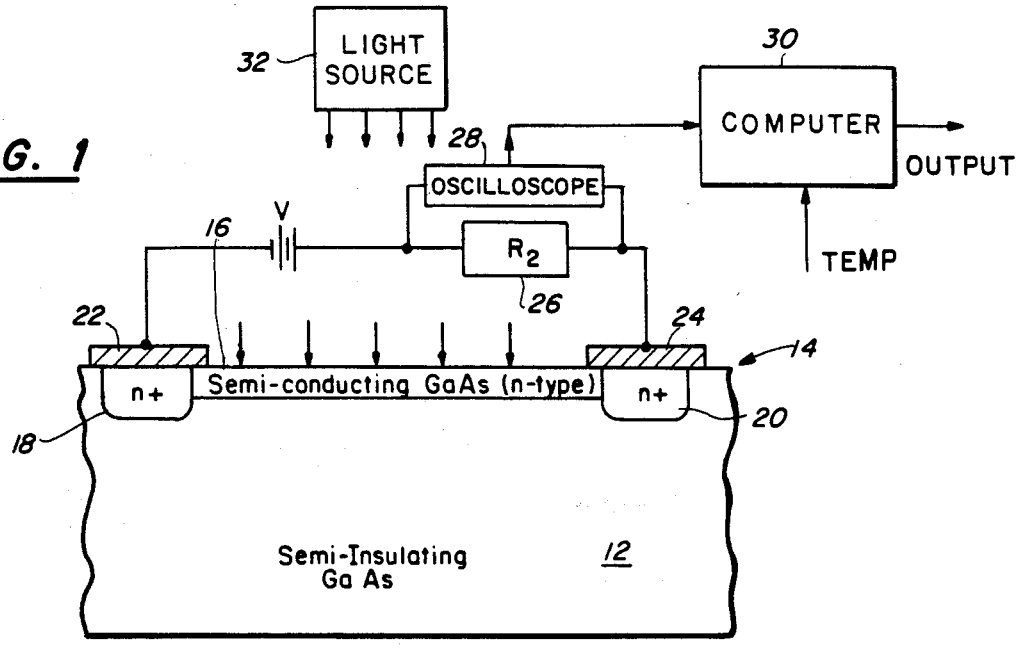
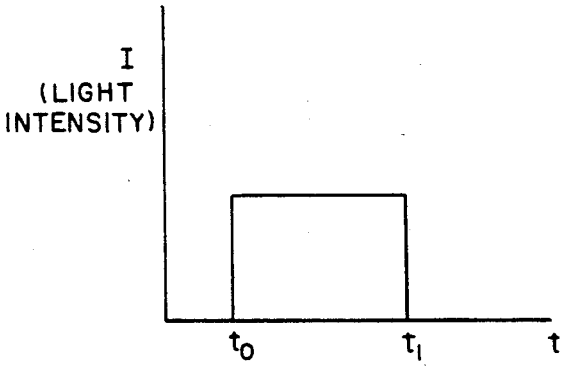
FIG. 2
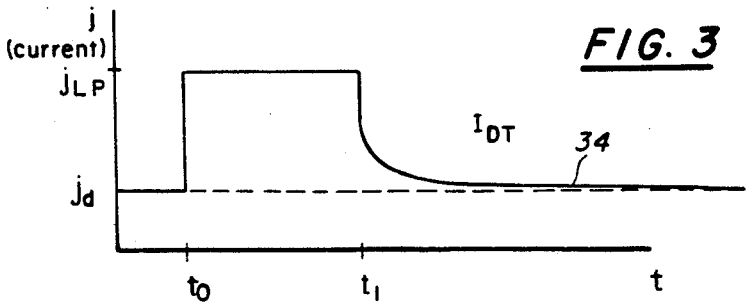
FIG. 3

GALLIUM ARSENIDE MATERIAL AND PROCESS EVALUATION BY MEANS OF PULSED PHOTOCONDUCTANCE IN TEST DEVICES

BACKGROUND OF THE INVENTION

The present invention relates generally to the field of semiconductor devices and, more particularly, to techniques for determining characteristics of semi-insulating gallium arsenide for use as substrate material in the manufacture of integrated circuits.

As is well known, semi-insulating gallium arsenide (GaAs) is used as a substrate material for GaAs integrated circuits. Nominally undoped, semi-insulating, liquid encapsulated Czochralski (LEC) grown GaAs contains deep donor defects compensated by shallow acceptor impurities which are primarily carbon ions. The impurities affect the performance and characteristics of electronic devices and integrated circuits fabricated on such substrates of GaAs. Specifically, the pinch-off voltage of ion-implanted n-channel field-effect transistors fabricated on semi-insulating GaAs substrates has been correlated with substrate acceptor impurities. The current method of assessing acceptor impurity concentrations is to measure the carbon concentration by using secondary ion mass spectroscopy (SIMs) analysis. This method is time consuming, requires expensive equipment and does not measure all the acceptors which may be present.

SUMMARY OF THE INVENTION

The present invention provides a method for assessing the acceptor impurity concentration in GaAs materials. The technique of the present invention is economical and time saving when compared to SIMs analysis.

In accordance with the present invention, light pulses are applied to an n-channel test device which is formed on the surface of a semi-insulating substrate of GaAs. The transient photoconductance across the test device resulting from light pulses is measured as a function of time, pulse amplitude and sample temperature and the data are analyzed by computer. The principle of the method of the present invention is that the conductance of the n-channel device is modulated by the induced photovoltage at the channel-substrate junction which is quantitatively related to the density of charged impurities in the substrate.

OBJECTS OF THE INVENTION

Accordingly, it is the primary object of the present invention to disclose a novel technique for assessing the acceptor impurity concentration in GaAs and the like materials.

Another object of the present invention is to disclose a technique for evaluating the quality of GaAs semi-insulating substrates in an inexpensive process that requires little equipment.

These and other objects of the invention will become more readily apparent from the ensuing specification when taken together with the drawings.

BRIEF DESCRIPTION OF THE DRAWINGS

FIG. 1 is a schematic illustration of a sample of GaAs substrate material with a test device constructed on the surface thereof and with the associated hardware connected thereto for measuring the induced photoconductance in the test device resulting from illuminating the test device.

FIG. 2 is a graph of the light intensity versus time of a sample light pulse used for illuminating the test device.

FIG. 3, aligned with FIG. 2 is a graph of the current, j, flowing across the test device as a function of time and illustrating the current "tail" resulting from photoconductance of the test device.

DESCRIPTION OF THE PREFERRED EMBODIMENT

Referring now to FIG. 1, the process of the present invention will be described by way of example with reference to semi-insulating GaAs substrate 12. Semi-insulating GaAs substrate 12 comprises a portion of a larger body of semi-insulating GaAs. In order to implement the test procedure of the method of the present invention, a test device 14 is formed on top of the semi-insulating GaAs substrate 12. The device 14 is formed by implanting an n-channel 16 and $n^+$ contacts 18 and 20 into the semi-insulating substrate 12 by well known techniques. Finally, metallic contact pads 22 and 24 are formed over the $n^+$ contacts 18 and 20 as is illustrated in FIG. 1. The formation of the n-channel device 14 is now complete.

In order to test the characteristics and properties of the semi-insulating GaAs substrate 12, a DC voltage supply, V, is connected with one negative terminal connected to metallic contact pad 22 and the other terminal connected to one end of load resistor 26. A digital oscilloscope 28 is connected across load resistor 26 and the right end of the oscilloscope 28 and the load resistor 26 are connected to the other metallic contact pad 24 as is illustrated. Further, a computer for analyzing the test data is connected to the output of the digital oscilloscope 28. Since in some test procedures it may be desirable and beneficial to vary the temperature of the sample 12, it is to be understood that it is within the scope of the present invention that the sample 12 may be kept in a heat bath or furnace (not shown) for maintaining and/or controlling the sample temperature. When sample temperature is a factor of consideration, the temperature information may be provided as an input to computer 30 to form a part of the basis of the analysis. Finally, pulsed light source 32 is positioned to illuminate the surface of the portion of the n-channel device between the metal contact pads 22 and 24. The pulsed light source may, for example, be a GaAs laser diode, an electron-beam source or any other pulsed light source suitable for causing the transient photoconductance in the test device 14 that is utilized to analyze and characterize the substrate sample 12.

The test procedure of the present invention operates as follows. When the voltage source V is turned on, a potential difference is applied between the contacts 18 and 20 of the test device 14. This results in the flow of dark current between contacts 18 and 20. This dark current is illustrated as current level $j_d$ in FIG. 3. Next, pulsed light source 32 is turned on thereby illuminating the surface of the semiconducting GaAs layer 16 between the metal contacts 22 and 24. This illumination creates excess charge carriers within the device 14 thereby producing two effects, both increasing the current between contacts 18 and 20. First, the conductivity of the material is increased due to photoconductivity. Secondly, the built-in voltage of the junction formed by the n-channel device 14 and the semi-insulating substrate 12 is decreased due to the photovoltaic effect thereby increasing the depth of the n-channel and, therefore, reducing its resistance. When the light from light source 32 is turned off, the current between contacts 18 and 20 decays with time to its original dark level.

FIG. 2 illustrates in terms of light intensity I versus time, the intensity of one light pulse from source 32 plotted between times $t_0$ and $t_1$. FIG. 3 which is aligned with FIG. 2 illustrates the dark current $j_d$ which flows in the test device 14 before it is illuminated by light from light source 13. FIG. 3 also illustrates the increase in current in the test device 14 occurring at time $t_0$ when a pulse is applied from light source 13 thereby resulting in current level $j_{LP}$. As can also be seen in FIGS. 2 and 3, when the light pulse from source 32 terminates at time $t_1$, the current between contacts 18 and 20 decays, asymptotically approaching the current level $j_d$. The photoconductive contribution of current decays within nanoseconds while the photovoltaic contribution lasts for milliseconds. In FIG. 3, the photoconductive decay appears as a vertical drop of the current at time $t_1$, followed by a gradual decrease of the current, the current "tail" 34, attributable to the photovoltaic contribution. This current "tail"0 34 has been discovered to provide an indication of the shallow acceptor concentration in the semi-insulating substrate 12. Analysis of the decay of the photovoltaic contribution to the observed photoconductance allows characterization of the shallow acceptor concentration in accordance with the present invention.

The current decay 34 is detected and observed by digital oscilloscope 28 and may be processed for analysis by means of computer 30. The method of analysis treats the decay of the transient photovoltage as being similar to the open-circuit voltage decay of a forward biased diode, as is described in "TRANSIENT RADIATION EFFECTS IN GaAs DEVICES: BULK CONDUCTION AND CHANNEL MODULATION PHENOMENA IN D-MESFET, E-JFET, AND $n^+$-SI-$n^+$ STRUCTURES", IEEE Transactions on Nuclear Science, Vol. NS-31, No. 6, Dec. 1984, authored by Larry D. Flesner, the entire text and figures of which are hereby incorporated by reference.

With reference to the aforesaid IEEE article, in the equations derived and disclosed therein, it can readily be understood that the device properties that are obtainable from the process of the present invention and that can be analyzed by computer 30 are (1) the magnitude of the stored dipole charge at the junction between the semiconducting layer 16 and the substrate 12, (2) the junction capacitance, and (3) an effective carrier recombination time in and near the junction which may be measured, for instance, by measuring the time that it takes the "tail" current 34 $I_{DT}$, to fall off by a factor of e. For an n-type conducting channel, properties (1) and (2) above determine the acceptor concentration near the channel. Comparison of derived device properties for different GaAs substrate materials and device fabrication processes can thus be a useful tool for material and process control in the manufacture of GaAs electronic components.

Obviously, many modifications and variations of the present invention are possible in the light of the above teachings. It is therefore to be understood that within the scope of the appended claims the invention may be practiced otherwise than as specifically described.

I claim:

1. A method for determining characteristics of a substrate of semi-insulating gallium arsenide comprising the steps of:

forming an n-channel on said surface of said gallium arsenide substrate;

forming first and second contacts to said n-channel on said gallium arsenide substrate;

applying a voltage to said first and second contacts;

illuminating said n-channel with a set of light pulses from a light source;

measuring the time dependent conductance of said n-channel.

2. The method of claim 1 further comprising the step of:

measuring the contribution of said time dependent photoconductance that is attributable to the photovoltaice effect within said n-channel device.

3. The method of claim 1 wherein said step of applying a voltage to said first and second contacts comprises the step of:

connecting an oscilloscope in parallel with a load resistor;

connecting a voltage source in series with said parallel connected oscilloscope and load resistor;

connecting said series connection of said voltage source and said parallel connected oscilloscope and load resistor, across said first and second contacts.

4. The method of claim 3 further comprising the step of connecting a computer to the output of said oscilloscope.

* * * * *